United States Patent [19]
Barnes
[11] 3,764,938
[45] Oct. 9, 1973

[54] RESONANCE SUPPRESSION IN INTERDIGITAL CAPACITORS USEFUL AS DC BIAS BREAKS IN DIODE OSCILLATOR CIRCUITS

[75] Inventor: Clare Earl Barnes, Bethlehem, Pa.
[73] Assignee: Bell-Telephone Laboratories, Incorporated, Murray Hill, N.J.

[22] Filed: Aug. 28, 1972
[21] Appl. No.: 283,983

[52] U.S. Cl. .................... 331/96, 317/256, 331/99, 331/107 R, 333/24 C, 333/73 S, 333/79, 333/84 M
[51] Int. Cl. .................... H01g 1/16, H03b 7/14
[58] Field of Search .................... 331/96, 99, 107 R, 331/107 G, 107 T; 333/24 C, 73 S, 79, 84 M; 317/242, 256

[56] References Cited

UNITED STATES PATENTS 3,521,243 7/1970 Fleming .................... 331/107 G X
3,593,208 7/1971 Smith .................... 333/84 M X
3,678,414 7/1972 Hallford .................... 333/84 M X

*Primary Examiner*—Roy Lake
*Assistant Examiner*—Siegfried H. Grimm
*Attorney*—W. L. Keefauver

[57] ABSTRACT

A modified stripline interdigital capacitor has slots coupled into the capacitor gap. These slots provide reactive loading to the slot transmission line formed by the gap. They are positioned and dimensioned to shift the frequency of the slot line resonance so that it is out of a selected frequency band without affecting the capacitance of the structure, and a resistive film applied over the loading slots serves to damp the shifted slot resonances. This interdigital structure may be used in a diode oscillator circuit to provide a dc block for isolating the input and output from the diode bias.

11 Claims, 6 Drawing Figures

RESONANCE SUPPRESSION IN INTERDIGITAL CAPACITORS USEFUL AS DC BIAS BREAKS IN DIODE OSCILLATOR CIRCUITS

BACKGROUND OF THE INVENTION

This invention relates to microwave integrated circuitry, especially interdigital capacitor bias breaks for diode amplifiers and oscillators, and more particularly to stripline interdigital capacitors having resonance control and suppression capability.

In recent years, diodes and particularly impact avalanche transit time (IMPATT) diodes have been used as the basis for solid-state oscillators and amplifiers in numerous microwave applications. The diode bias must, of course, be isolated from the remainder of the circuit, and the necessary dc breaks have been provided by chip capacitors. Alternatively, a stripline interdigital capacitor may be used where the circuitry includes any type of strip transmission line; as used herein, any transmission line structure, such as stripline or microstrip, which includes a flat conductor and at least one separated ground plane will be referred to as a strip transmission line or stripline.

The stripline conductor is split into two sections to form the interdigital capacitor. Each section has a set of conductive fingers (normally rectangular in shape) protruding from one end. The sections are positioned on a substrate so that the fingers of one section are interdigitated with the fingers of the other, and the two sections are separated by a continuous dielectric (of air or other material). The protruding fingers serve as opposing electrodes and the serpentine region between them is the capacitor gap.

The capacitor must be impedance-matched to the circuit over the operating frequency band so that it is electrically transparent, and since the capacitance is inversely related to the reactance, a high capacitance makes the required matching over a broadband frequency range easier than with a lower capacitance. Unfortunately, the interdigital structure normally exhibits a very small total capacitance — on the order of a few pF. It can be increased by decreasing the gap width and/or by increasing the gap length, but for practical reasons, dictated by the materials and processes, the gap width cannot be decreased indefinitely without producing a dc path, and while the gap length can be increased, the capacitor gap acts as an open circuited slot line which produces slot line resonance whenever the gap length (corrected for the susceptive loading at the bends) is a multiple of one-half of a wave-length. Accordingly, the longer the gap, the lower and more closely spaced are the spurious resonant frequencies which the gap will support, and the more likely that undesirable resonances will fall within the operating frequency band of the device.

In a copending U.S. Pat. application, Ser. No. 283,984 filed on an even date herewith and assigned to the assignee hereof, J. W. Gewartowski and I. Tatsuguchi have suggested a method for shifting the slot line resonances out of a selected frequency band for a given interdigital capacitor configuration. Short slots cut into the stripline conductor are coupled into the capacitor gap. These slots are dimensioned to reactively load the gap slot line and therefore shift its resonance frequency while introducing only a small change in the capacitance of the device. However, the operation of the capacitor is still affected by the presence of the slot line resonances, notwithstanding that they may be shifted by appropriate design.

It is the principal object of the present invention to provide a stripline interdigital capacitor which is free of spurious resonance within a selected operating frequency band. It is a further object to improve the operation of the resonance control arrangement proposed by J. W. Gewartowski and I. Tatsuguchi. It is also an object to provide an improved bias break for a diode-type oscillator or amplifier in which spurious resonances are eliminated from the device's operating frequency band.

SUMMARY OF THE INVENTION

The conventional stripline interdigital capacitor is modified by cutting a slot or a number of them into the conductor If they are properly dimensioned and positioned, they couple with the capacitor gap and produce reactive loading which shifts the resonance frequency produced by the gap. In accordance with the present invention, a resistive film is deposed over the slot or slots to damp the shifted slot line resonance and the film is positioned so that it has negligible effect upon the loss of the capacitor. The structure may be used as a dc bias break in diode-type oscillators and amplifiers.

DETAILED DESCRIPTION

Figure 1:
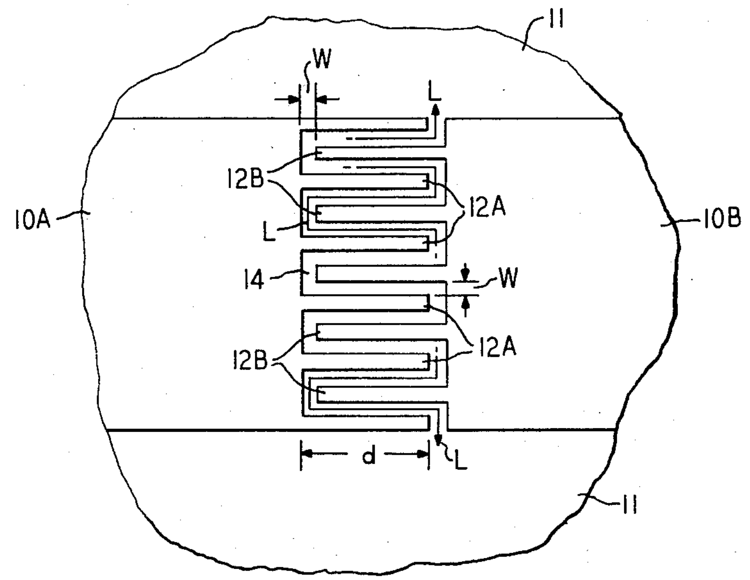
FIG. 1 PRIOR ART
FIG. 1 is a plan view of the conventional strip-line interdigital capacitor.

FIG. 1 illustrates the conductor pattern of a conventional stripline interdigital capacitor. The conductor consists of two sections, 10A and 10B, mounted on substrate 11. Each section has fingers 12A and 12B extending from the body of conductor sections 10A and 10B, respectively, toward the other section. The serpentine space between fingers 12A and 12B is the capacitor gap 14. Its width W is on the order of a few mils and its circuitous length L is determined by the lengths and the number of fingers 12. The capacitor may be covered with any appropriate dielectric to prevent the entry of extraneous material into the gap.

The capacitance of the structure is a function of its dimensions. The incremental capacity is dependent essentially upon the fringing capacity which is determined by the gap width W, and the total capacitance is the product of the incremental capacity and the gap length L. The total capacitance can be increased by decreasing the gap width W, but this is limited in the extreme by the materials and processes being used. Alternatively, the capacitance can be increased by increasing the finger length *d*, or by adding fingers, but since the gap acts as a resonant slot transmission line, the longer gap will support a lower primary resonance frequency and hence the lieklihood of a resonant frequency falling within the selected frequency band is increased.

Figure 2:
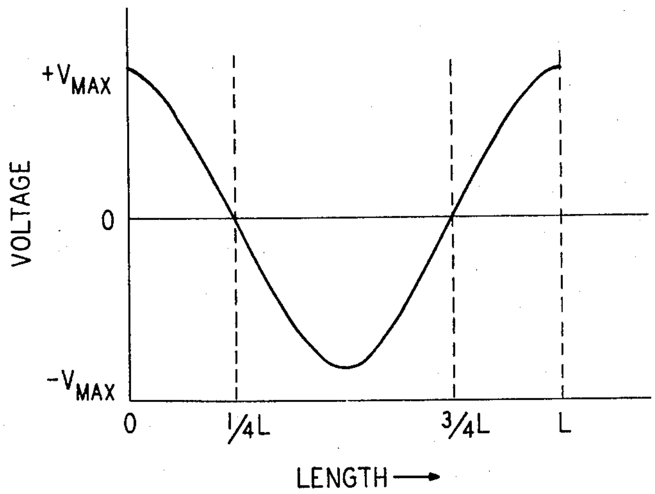
FIGS. 2 and 3 are plots of voltage vs. capacitor gap length for full-wave and half-wave resonance respectively, helpful in explaining the invention.
Figure 3:
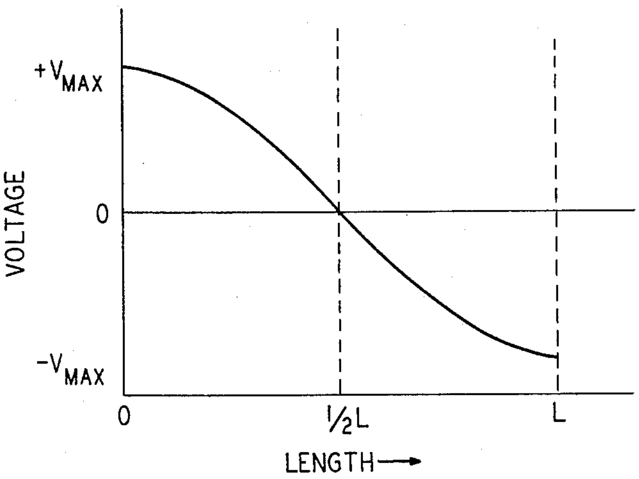

The resonances exist at frequencies for which the length L of the gap is a multiple of one-half of a wavelength. The cosine wave of FIG. 2 illustrates the voltage wave pattern of full-wave resonance in a transmission line of length L. The maxima occur at the ends of the line at O and L with nulls at one-quarter L and three-quarters L. FIG. 3 illustrates the voltage wave pattern of half-wave resonance with the maxima at O and L, and a null at one-half L.

The resonant frequency $f_r$ is determined by $$f_r = nv/2L \qquad (1)$$

where $n$ is an integer depending upon the order of the resonance and $v$ is the velocity of propagation along the slot transmission line. For full-wave resonance, $n$ is even and for half-wave resonance, $n$ is odd; hence, $n = 2$ for the primary full-wave resonance and $n = 1$ for the primary half-wave resonance.

As an example, with the dielectric constant of air, $v = 3 \times 10^{10}$ cm/sec. Accordingly, for a very short length L, such as 1 cm, the primary half-wave resonant frequency will be at 15 GHz, and the lowest full-wave resonant frequency will be 30 GHz. A capacitor having this gap length will thus provide no resonance problems if operation is below 15 GHz. However, the slot length of only 1 cm will produce such a small capacitance as to be useless for most applications. For a longer gap length, such as 10 cm, the primary half-wave resonance will occur at 1.5 GHz, the primary full-wave resonance at 3 GHz, and higher order resonances at successive intervals of 1.5 GHz. In practical structures, the dielectric loading reduces the value of $v$ and the resonant frequencies are proportionately reduced.

Figure 4:
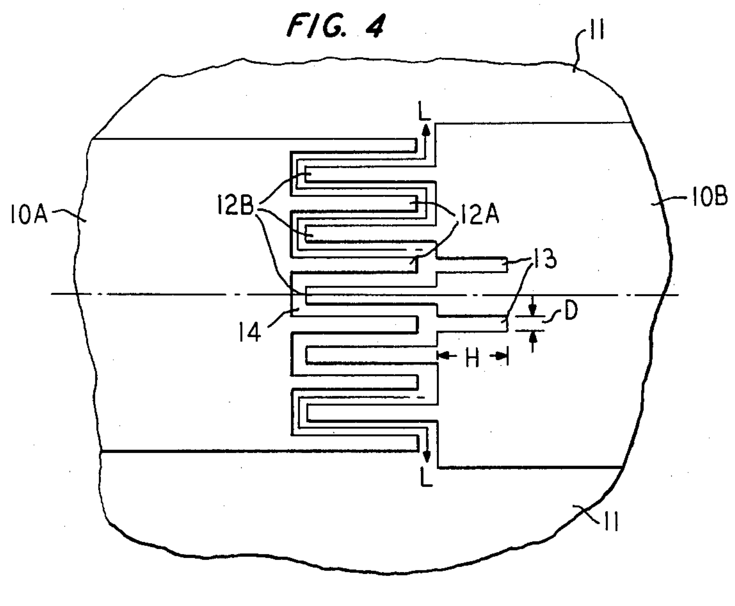
FIG. 4 is a plan view of an interdigital capacitor having resonance frequency control capability.

FIG. 4 illustrates an interdigital structure in which resonance is controlled as disclosed in the aforementioned J. W. Gewartowski- I. Tatsuguchi application. Conductor 10 is arranged with interdigitated fingers 12A and 12B as in FIG. 1 and the gap 14 acts as a slot transmission line. The capacitance of the device is determined by the actual length L, but without changing the actual length L and hence without affecting the capacitance, the effective gap length may be adjusted by reactively loading the slot transmission line. This is accomplished by means of a pair of slots 13 cut out of conductor section 10B. The slots which have a height H less than $\lambda/4$, where $\lambda$ is $v/f$, and $f$ is the operating frequency, act essentially as shorted stubs on a transmission line, and they load the slot line as would an inductance in series. Therefore, the addition of slots 13 increases the effective electrical length of gap 14 and as can be seen from Equation (1), this lowers the resonant frequencies.

For maximum loading slots 13 should be coupled into the transmission line at or near voltage null points where the maximum current exists. To shift half-wave resonances, a single loading slot 13 is preferably positioned on the center line of conductor 10 so that it couples at the midpoint of gap length L. The pair of slots 13 shown symmetrically displaced from the center line of conductor 10, are illustrative of an arrangement for shifting full-wave resonances. The voltage nulls appear for the primary full-wave resonance at L/4 and 3L/4 and the second order full-wave resonance will have nulls at ⅛ L, ⅜ L, ⅝ L and ⅞ L so that the location of slots 13 can be selected according to the resonance frequency being shifted. Although the slots may be placed in either sections 10A or 10B or both, and thus may be coupled substantially at any of the selected nulls, symmetry is preferred and impedance matching considerations must also be taken into account when positioning the slots. In addition, when shifting resonant frequency below the selected band, care must be taken so that a higher order resonance which will also be shifted, will not appear within the operating band.

Figure 5:
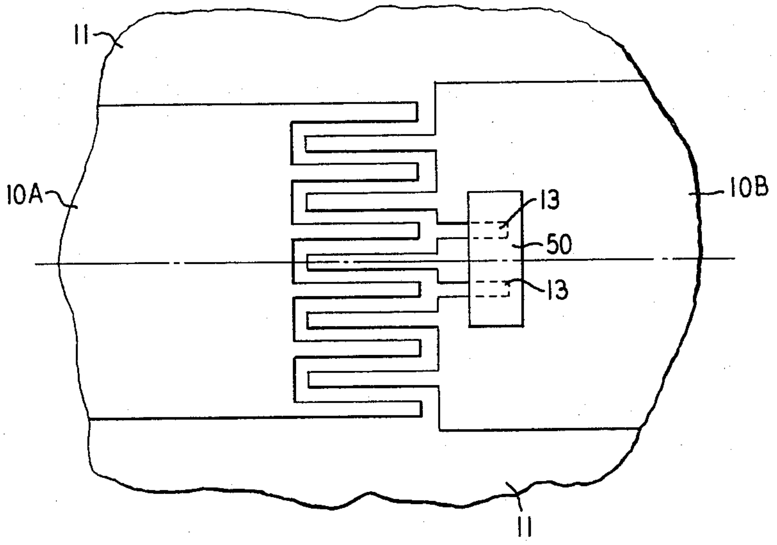
FIG. 5 is a plan view of an interdigital capacitor having resonance frequency control and suppression capability in accordance with the present invention.

FIG. 5 illustrates the structure of FIG. 4 modified in accordance with the present invention. Resistive film 50 is placed over the reactive loading slots 13, and this film serves to damp the slot line resonances to the point where their effect on the impedance of the capacitor is negligible. Film 50 must be parallel to and lie essentially in the plane of conductor 10 so that it couples with the resonant electric field but does not couple with the signal's electric field which is predominantly perpendicular to its conductor. The film may be deposited directly on substrate 11 so that it lies immediately on the conductor or it may be on a thin carrier such as a sheet of mica, which is appliqued to the substrate. When the slots 13 are located near the center of conductor 10, as illustrated, the potential across the film due to the signal on the conductor is negligible and therefore the signal loss is negligible; yet, the potential across the film due to the resonant frequencies in the slots will be relatively large, and this resonant energy will be dissipated.

The use of a lossy film for selective damping of slot line resonances, will provide considerable increase in the bandwidth of interdigital capacitors; it will also increase the range of achievable capacitance and accordingly give designers greater freedom in dimensioning the structures. The technique is applicable where the slots are on the center line for damping half-wave resonance, or where the slots are off-center for damping full-wave resonance.

Figure 6:
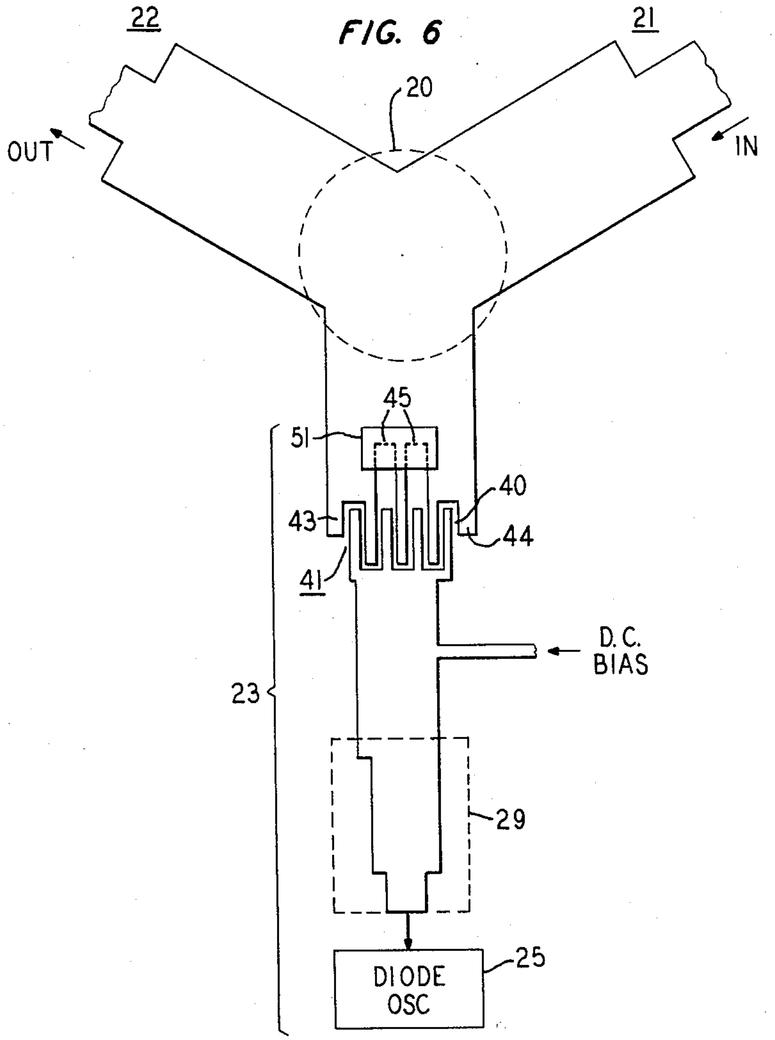
FIG. 6 is a plan view of a conductor pattern of a diode oscillator circuit employing the interdigital capacitor in accordance with the present invention.

FIG. 6 illustrates the use of the improved resonance suppressing interdigital capacitor as a dc bias break in a diode oscillator circuit. Circulator 20 couples input arm 21 to diode arm 23 and couples diode arm 23 to output arm 22 in a standard manner. Conventionally, circulator 20 includes matching network so that each port is matched to a standard impedance such as 50 ohms. Diode oscillator 25 is biased by a dc source and interdigital capacitor 41 acts as the dc bias block. The additional matching necessitated by the addition of the capacitor is provided by element 29, which is essentially a section of the conductor appropriately dimensioned in a well-known manner to act as an impedance transformer.

End fingers 43 and 44 are cut short to establish a selected capacitance by delineating the length of the gap 40 and this gap length incidentally provides a full-wave resonance assumed to be within the operating frequency band. The two off-center slots 45 load gap 40 and shift the resonance frequency. Resistive film 51 overlaying slots 45 couples with the electric field of the resonance in the slots and damps the shifted spurious resonance.

Of course, if the spurious resonance generated by the selection of the gap length were of the half-wave type, an on-center slot could be used and the suppression by use of film 51 would be equally applicable.

In all cases it is to be understood that the above-described arrangements are merely illustrative of a small number of the many possible applications of the principles of the invention. Numerous and varied other arrangements in accordance with these principles may readily be derived by those skilled in the art without departing from the spirit and scope of the invention.

What is claimed is:

1. An interdigital capacitor comprising, a stripline having a first and second section of conductive material, each section having a set of fingers protruding from one end, said sections being positioned to interdigitate the fingers of one section with the fingers of the other so that a continuous gap is created between the conductive sections, the gap forming a resonant transmission line, at least one slot cut into one of the conductive sections and coupling into the gap, said slot being dimensioned and positioned to shift the frequency of resonance of the transmission line out of a selected frequency band, and a resistive film positioned across said slot for dissipating the energy of the shifted resonance.

2. An interdigital capacitor comprising: a stripline having a first and second section of conductive material, each section having a set of fingers protruding from one end, said sections being positioned to interdigitate the fingers of one section with the fingers of the other so that a continuous gap is created by the conductive sections, the gap forming a resonant transmission line, means for reactively loading the transmission line formed by the gap to shift its frequency of resonance, said reactive loading means including at least one slot cut into one of the conductive sections and coupling into the gap, CHARACTERIZED IN THAT, a resistive film is positioned across said slot for dissipating the energy of the shifted resonance.

3. An interdigital capacitor as claimed in claim 2 wherein said conductive material is affixed to a substrate and said resistive film is applied to the substrate and lies essentially in the plane of the conductive material.

4. An interdigital capacitor as claimed in claim 2 wherein said conductive material is affixed to a substrate and said resistive film is positioned on a sheet of intermediate material, said sheet being applied to the substrate.

5. An interdigital capacitor as claimed in claim 2 wherein said slot is coupled to the gap substantially at the voltage null point of the standing wave pattern of the resonance being shifted.

6. An interdigital capacitor as claimed in claim 5 wherein said slot is coupled into the center of the gap to shift a half-wave resonant frequency.

7. An interdigital capacitor as claimed in claim 5 wherein said slot is coupled to the gap at a point off the center of the gap to shift a full-wave resonant frequency.

8. An interdigital capacitor as claimed in claim 2 wherein said means for reactively loading the transmission line includes a pair of slots cut into one conductive section and symmetrically displaced from the center line of that section to shift a full-wave resonant frequency, and said resistive film is positioned across both of said slots.

9. A circuit for operating in a selected frequency band comprising: an oscillator having an input port, output port and a diode port, a diode oscillator coupled to the diode port; bias means for applying a dc bias to the diode oscillator; means for blocking the dc bias from the input and output ports including at least one stripline interdigital capacitor as claimed in claim 2.

10. A circuit for operating in a selected frequency band comprising; an oscillator having an input port, output port and a diode port, a diode oscillator coupled to the diode port; bias means for applying a dc bias to the diode oscillator; means for blocking the dc bias from the input and output ports including at least one stripline interdigital capacitor coupled to one of the ports; said one capacitor including a conductor having two sets of interconnected conductive fingers intedigitated to form a gap between the fingers of the two sets, said gap having a length such that it is capable of supporting resonance at a first frequency, and at least one slot within said conductor being coupled to the gap and dimensioned to extend the effective length of the gap so that the capacitor's resonance is shifted to a second frequency outside the selected frequency band; CHARACTERIZED IN THAT a resistive film is positioned across said slot parallel to the plane of the conductor to damp the energy of the shifted resonance.

11. An oscillator circuit as claimed in claim 10 wherein said means for blocking dc bias includes a single interdigital capacitor coupled to the diode port.

* * * * *